United States Patent
Ingle

(10) Patent No.: US 9,257,492 B2
(45) Date of Patent: Feb. 9, 2016

(54) METHOD FOR PRODUCING A PASSIVE ELECTRONIC COMPONENT, METHOD FOR PRODUCING AN OPTOELECTRONIC ASSEMBLY AND PASSIVE ELECTRONIC COMPONENT

(71) Applicant: OSRAM OLED GmbH, Regensburg (DE)

(72) Inventor: Andrew Ingle, Allershausen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/430,942

(22) PCT Filed: Aug. 20, 2013

(86) PCT No.: PCT/EP2013/067348
§ 371 (c)(1),
(2) Date: Mar. 25, 2015

(87) PCT Pub. No.: WO2014/048639
PCT Pub. Date: Apr. 3, 2014

(65) Prior Publication Data
US 2015/0255521 A1    Sep. 10, 2015

(30) Foreign Application Priority Data
Sep. 27, 2012    (DE) .......................... 10 2012 109 142

(51) Int. Cl.
*H01L 21/8222*    (2006.01)
*H01L 29/00*    (2006.01)
(Continued)

(52) U.S. Cl.
CPC ............ *H01L 27/3225* (2013.01); *H01G 4/005* (2013.01); *H01G 4/33* (2013.01);
(Continued)

(58) Field of Classification Search
CPC ....................... H01L 23/5227; H01L 27/0658
USPC .......................... 438/329, 957; 257/528, 532
See application file for complete search history.

(56) References Cited

U.S. PATENT DOCUMENTS 6,335,211 B1 * 1/2002 Lee .................................. 438/22
6,800,999 B1 * 10/2004 Duggal et al. ............. 315/169.1
(Continued)

FOREIGN PATENT DOCUMENTS

DE    102009060066 A1    3/2011
DE    112008003787 T5    3/2012

OTHER PUBLICATIONS

German Search Report based on Application No. 10 2012 109 142.0(5 pages) dated Jun. 25, 2013.

*Primary Examiner* — Theresa T Doan
(74) *Attorney, Agent, or Firm* — Viering, Jentschura & Partner

(57) ABSTRACT

Various embodiments may relate to a method for producing a passive electronic component, including forming a first electrically conductive layer on a substrate, forming a second electrically conductive layer on the first electrically conductive layer, forming a first trench in the first and second electrically conductive layers such that the substrate is exposed in the first trench, wherein the first trench separates a first contact region from a second contact region, applying a dielectric in a structured fashion to the second electrically conductive layer in the first contact region and at least partly to the substrate in the first trench such that the dielectric electrically insulates the first contact region from the second contact region, and applying an electrically conductive electrode layer in a structured fashion to the dielectric above the first contact region and to the second contact region.

18 Claims, 6 Drawing Sheets

(51) Int. Cl.
*H01L 27/32* (2006.01)
*H01G 4/33* (2006.01)
*H01G 4/005* (2006.01)
*H01L 27/01* (2006.01)
*H01L 49/02* (2006.01)
*H01L 27/06* (2006.01)
*H01L 51/56* (2006.01)

(52) U.S. Cl.
CPC ......... *H01L 27/016* (2013.01); *H01L 27/0682* (2013.01); *H01L 28/20* (2013.01); *H01L 28/40* (2013.01); *H01L 28/60* (2013.01); *H01L 51/56* (2013.01)

(56) References Cited

U.S. PATENT DOCUMENTS

| | | |
|---|---|---|
| 7,012,585 B2 | 3/2006 | Agostinelli et al. |
| 2010/0327313 A1 | 12/2010 | Nakamura |
| 2012/0267147 A1 | 10/2012 | Ingle et al. |

* cited by examiner

METHOD FOR PRODUCING A PASSIVE ELECTRONIC COMPONENT, METHOD FOR PRODUCING AN OPTOELECTRONIC ASSEMBLY AND PASSIVE ELECTRONIC COMPONENT

RELATED APPLICATIONS

The present application is a national stage entry according to 35 U.S.C. §371 of PCT application No.: PCT/EP2013/067348 filed on Aug. 20, 2013, which claims priority from German application No.: 10 2012 109 142.0 filed on Sep. 27, 2012, and is incorporated herein by reference in its entirety.

TECHNICAL FIELD

Various embodiments relate to a method for producing a passive electronic component, a method for producing an optoelectronic assembly and a passive electronic component.

BACKGROUND

In optoelectronic components such as organic light emitting diodes, insulators and/or dielectrics serve, inter alia, to separate and/or electrically insulate two electrode regions from one another.

Suitable insulators or dielectrics such as light-sensitive resists, for example, are usually very expensive and complex to apply, for example in a photolithographic process. By way of example, the resists are applied without structure in a planar fashion to metal layers subsequently to be etched and are exposed with the aid of a mask. Depending on the resist used, the exposed or non-exposed regions can then be removed, as a result of which the resist layer is structured. During the subsequent etching process, the resist structures that remained protect the underlying metal layer or the underlying metal layers.

SUMMARY

In various embodiments, a method for producing a passive electronic component and/or a method for producing an optoelectronic assembly are provided which enable the production of a passive electronic component and/or an optoelectronic assembly simply and/or in a cost-effective manner and/or without the use of a photolithographic process.

In various embodiments, a passive electronic component is provided which can be produced simply and/or in a cost-effective manner and/or without the use of a photolithographic process.

In various embodiments, a method for producing a passive electronic component is provided. In this case, a first electrically conductive layer is formed on a substrate. A second electrically conductive layer is formed on the first electrically conductive layer. A first trench is formed in the first and second electrically conductive layers such that the substrate is exposed in the first trench. The first trench separates a first contact region from a second contact region. A dielectric is applied in a structured fashion to the second electrically conductive layer in the first contact region and the substrate in the trench such that the dielectric electrically insulates the first contact region from the second contact region. An electrically conductive electrode layer is applied in a structured fashion to the dielectric above the first contact region and to the second contact region.

The fact that the dielectric and/or the electrode layer and/or subsequently further layers or materials are "applied in a structured fashion" means, in various embodiments, that the desired structure is already formed during the application of the corresponding layer. The area to be coated is thus coated only in partial regions dependent on the desired structure.

This is in contrast to planar application of the corresponding layers and subsequent structuring of the layers, as is the case for example in a photolithographic method. The structured application of the layers makes it possible to be able to dispense with the firstly planar application of the corresponding layers and the subsequent complex structuring of the layers, for example the photolithographic method, and/or an expensive photoresist for the photolithographic method. This contributes to simple and/or cost-effective production of the passive electronic component.

The corresponding materials or layers can be applied in a structured fashion to the substrate for example by printing, for example inkjet printing or screen printing, by blade coating and/or by deposition with the aid of SAMs (self assembling monolayers) and the like.

A passive electronic component can be for example a capacitor and/or a resistor or a combination, for example a series circuit and/or a series connection of one, two or more capacitors and/or one, two or more resistors.

The substrate may include or be a substrate layer, for example. The substrate can be for example a transparent or a non-transparent substrate. By way of example, the substrate may include glass, quartz, sapphire, one or a plurality of plastic films, one or a plurality of coated plastic films, metal, one or a plurality of metal films, one or a plurality of films coated with an electrically insulating layer, a silicon wafer or some other suitable substrate material. Substrate can be understood to mean for example the layer to which all other layers are subsequently applied during the production of an optoelectronic assembly. Such subsequent layers can be for example layers required for the radiation emission.

The first electrically conductive layer includes a first electrically conductive material and the second electrically conductive layer includes a second electrically conductive material. The first and/or the second electrically conductive material are materials or substances having the capability of conducting electric current. The first electrically conductive material can differ from the second electrically conductive material, for example. By way of example, the first electrically conductive material can be provided for first electrodes, for example for the anodes or cathodes, of the optoelectronic components.

The first electrically conductive layer can be deposited for example directly on the substrate layer. The first electrically conductive layer can be for example a transparent conductive layer. It can be formed, without being restricted thereto, from a transparent conductive oxide (TCO), e.g. indium-doped tin oxide (ITO) or ZnO, In/ZnO, SnZnO, Al—ZnO and the like. The first electrically conductive layer can be applied to the substrate layer for example by sputtering, for example DC sputtering, physical vapor deposition (PVD) or the like.

The second electrically conductive layer can be deposited on the first electrically conductive layer, for example. The second electrically conductive material can include, for example, without being restricted thereto, one or a plurality of metals, for example aluminum, barium, indium, copper, silver, gold, magnesium, calcium and lithium and the like and mixtures or combinations thereof, for example in the form of alloys among one another or with other metals. The second electrically conductive layer can be applied to the first electrically conductive layer for example by evaporation, sputtering, for example DC sputtering, physical vapor deposition (PVD) or the like.

The electrically conductive layers may in each case also include partial layers, for example, which may also include chromium and molybdenum, for example, as an alternative or in addition to the metals mentioned. Examples of possible layer sequences in an electrically conductive layer or an electrically conductive layer including a plurality of partial layers are Mo—Al—Mo, Cr—Al—Cr, Cr—Cu—Cr and Cr—Cu.

The dielectric denotes for example an electrically insulating substance applied in such a way that it prevents a current flow between two electrically conductive regions, for example between the first electrically conductive layer or the second electrically conductive layer in the first component region and the first electrically conductive layer or second electrically conductive layer in the second component region. The dielectric can be a covering or a coating agent, for example a polymer and/or a resist. The resist may include for example a coating substance that can be applied in liquid or pulverulent form.

The electrode layer may for example include or be formed from aluminum, barium, indium, silver, gold, magnesium, calcium and/or lithium and combinations thereof or a compound thereof, in particular an alloy, and/or transparent conductive oxides, such as, for example metal oxides, such as zinc oxide, tin oxide, cadmium oxide, titanium oxide, indium oxide or indium-doped tin oxide (ITO), aluminum-doped zinc oxide (AZO), $Zn_2SnO_4$, $CdSnO_3$, $MgIn_2O_4$, $GaInO_3$, $Zn_2In_2O_5$ or $In_4Sn_3O_{12}$ or mixtures of different transparent conductive oxides. The electrode layer can form cathodes or anodes of the passive electronic component, for example.

The trench can be formed by laser ablation, for example. Furthermore, the trench can extend partly or completely around the first contact region and/or the second contact region. Furthermore, even further trenches can be formed and/or the trenches can be part of a trench structure extending two-dimensionally in a plane.

In various embodiments, a first electrode of a capacitor is formed by the first contact region between the dielectric and the substrate and a second electrode of the capacitor is formed by the electrode layer on a side of the dielectric facing away from the first contact region. When an electrical voltage is applied to the first and second contact regions, the capacitor is charged, in particular the electrodes are charged, and an electric field forms between the electrodes. The electrical energy in the electric field existing between the charged electrodes is stored in the charged capacitor.

In various embodiments, before the dielectric is applied, a second trench and at least one third trench are formed, which delimit a resistance region. The resistance region includes a part of the first and second electrically conductive layers. The resistance region has a taper in a direction parallel to the electrically conductive layers and leads into the first contact region on a first side of the taper. The resistance region can contribute, for example, to forming an electrical resistor that is integrated in the layer structure of the passive electrical component and/or that forms a part thereof. The electrical resistor can be connected in series or in parallel with the capacitor, for example.

In various embodiments, the resistance region is formed such that it leads into the second contact region on a second side of the taper and thus forms a resistor that is electrically connected in parallel with the capacitor.

In various embodiments, the resistance region is formed such that it forms a third contact region on a second side of the taper and thus forms a resistor that is electrically connected in series with the capacitor.

In various embodiments, two, three or more capacitors and/or resistors as claimed in the preceding claims are formed electrically in parallel with one another and/or electrically in series one after another.

In various embodiments, at least one of the trenches is formed by laser ablation. This can contribute to the simple and cost-effective production of the passive electronic component. By way of example, an etching process for etching the trench can be dispensed with.

In various embodiments, the dielectric is applied by a printing method. This can contribute simply to applying the dielectric in a structured fashion to the second electrically conductive layer and the substrate. The printing method may include for example inkjet printing or screen printing, and/or.

In various embodiments, the dielectric firstly is applied in a structured fashion to the second electrically conductive layer in such a way that the dielectric adjoins the first trench, and is then heated in such a way that it deforms and encapsulates edges and/or side surfaces of the first and second electrically conductive layers in the first trench. The dielectric adjoining the trench flows on account of the heating over these exposed edges and/or side surfaces of the first and second electrically conductive layers and encapsulates them. The fact that the dielectric adjoins the trench can mean, for example, that the dielectric is arranged in a structured fashion near to, directly at or even partly above the first trench such that it flows at least partly into the first trench upon liquefying. As an alternative thereto, the dielectric can be applied in a structured fashion such that even without the heating and/or before the heating it is arranged at least partly in the first trench and/or encapsulates the edges and/or side surfaces of the electrically conductive layers and/or electrically insulates the first contact region from the second contact region.

In various embodiments, a method for producing an optoelectronic assembly is provided, wherein a passive electronic component is formed, for example in accordance with the method explained above. The dielectric is applied in a structured fashion to the second layer such that the dielectric demarcates a component region for forming an optoelectronic component relative to the second contact region. An optically functional layer is formed in the component region. The electrode layer is applied in a structured fashion such that a part of the electrode layer covers the optically functional layer.

An optoelectronic component can be for example a component which absorbs or emits electromagnetic radiation. A component which absorbs electromagnetic radiation can be a solar cell, for example. In various embodiments, a component which emits electromagnetic radiation can be a semiconductor component which emits electromagnetic radiation and/or can be embodied as a diode which emits electromagnetic radiation, as an organic diode which emits electromagnetic radiation, as a transistor which emits electromagnetic radiation or as an organic transistor which emits electromagnetic radiation. The radiation can be for example light in the visible range, UV light and/or infrared light. In this connection, the component which emits electromagnetic radiation can be embodied for example as a light emitting diode (LED) as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

The optically functional layers can be for example radiation emitting layers, such as fluorescent and/or phosphorescent emitter layers, for example those of components which emit electromagnetic radiation, for example LEDs or OLEDs.

In various embodiments, before the optically functional layer is applied, the second electrically conductive layer is removed in the component region. The optically functional layer is applied to the first electrically conductive layer in the component region. The second electrically conductive layer can be removed in an etching method, for example. In this case, the second electrically conductive material can be etched in an etching bath, for example. The etching may include for example the removal of the second electrically conductive material on the surface of the first electrically conductive layer by the use of suitable etching substances. The etching substances can be for example chemical substances which can alter (usually oxidize) the material to be removed in a chemical reaction and/or can dissolve said material. Etchants are acids or strong oxidants, for example. Mention may be made of, for example, $HNO_3$, $HCl$, $H_3PO_4$, acetic acid, $H_2SO_4$, cerium ammonium nitrate (CAN) and $H_2O_2$. The etching bath can be chosen for example such that the first electrically conductive layer, for example an ITO layer, is not attacked or adversely affected by the etchants used.

In various embodiments, after the structured application of the dielectric and before the removal of the second electrically conductive layer in the component region, a protective layer is applied in a structured fashion to the first contact region and the second contact region and, if appropriate, to the resistance region such that the contact regions and, if appropriate, the resistance region are covered with the material of the protective layer. The protective layer protects the contact regions and, if appropriate, the resistance region during the removal of the second electrically conductive layer, such that the second electrically conductive layer is maintained in the contact regions and, if appropriate, the resistance region. The protective layer is removed after the removal of the second electrically conductive layer in the component region.

The protective layer may include for example a material or a substance which serves to protect the second electrically conductive material of the second electrically conductive layer in the partial regions on which it is applied on the second electrically conductive layer, in the further method sequence for producing the optoelectronic assembly, for example in one or a plurality of further process steps. The protective layer can be for example a covering, a resist or the like. By way of example, the protective layer can be an etch stop resist, for example an etch stop resist such as is used in the production of printed circuit boards (PCBs). Said etch stop resist can be crosslinked or cured thermally or by UV radiation. The protective layer can be soluble for example in a solvent in which the dielectric is insoluble. By way of example, the protective layer can be alkali soluble or base soluble. By way of example, the protective layer can be soluble in an alkaline solution, for example a weakly alkaline aqueous solutions of salts (e.g. NaOH, KOH, $NH_4OH$, or quaternary ammonium salts such as $N(CH_3)_4OH$).

The structured application of the protective layer can be carried out either after the application of the second electrically conductive layer on the first electrically conductive layer and before the structured application of the dielectric on the second electrically conductive layer or after the structured application of the dielectric on the second electrically conductive layer and before the application of the optically functional layer on the second electrically conductive layer. In this case, the structured application of the protective layer can be carried out in such a way that the second electrically conductive layer is covered with the material of the protective layer in the contact regions and is not covered with the material of the protective layer in the component regions. The protective material can be arranged—at least in sections—above or on the dielectric.

By way of example, both the dielectric and the protective layer can be resistant to the chemicals used for etching the second electrically conductive material. The dielectric and the protective layer, in those regions of the second electrically conductive layer on which they are applied, can serve as an etch stop for the second electrically conductive layer or the second electrically conductive material in the corresponding regions. As a result of the etching of the second electrically conductive material, the structures of the second electrically conductive layer which lie below the dielectric and/or below the protective layer and those of the first electrically conductive layer are maintained. The etching process for removing the second electrical layer in the component region can be, for example, the sole etching process which is carried out for producing the optoelectronic assembly.

In various embodiments, the optically functional layer is formed after the heating of the dielectric.

In various embodiments, a first electrode of an optoelectronic component is formed by the first electrically conductive layer between the optically functional layer and the substrate and a second electrode of the optoelectronic component is formed by the electrode layer on a side of the optically functional layer facing away from the first electrode. The optoelectronic component includes the organically functional layer between the first and second electrodes of the first optoelectronic component. By way of example, the first electrode forms an anode of the optoelectronic component and the second electrode forms a cathode of the optoelectronic component. As an alternative thereto, the first electrode can form a cathode of the optoelectronic component and the second electrode can form an anode of the optoelectronic component.

In various embodiments, the passive electronic component and the optoelectronic component are connected in series via the second contact region.

In various embodiments, the protective layer is applied by a printing method. This can contribute to the protective layer being applied in a structured fashion to the second electrically conductive layer and the substrate. The printing method may include for example inkjet printing or screen printing, and/or blade coating.

The dielectric can be acid soluble or base soluble, for example. This can contribute to the dielectric being removed simply by an acid or a base. By way of example, the material of the protective layer is base soluble and the dielectric is acid soluble. As an alternative thereto, the material of the protective layer is acid soluble and the dielectric is base soluble. This has the effect that the dielectric remains intact during the removal of the protective layer.

In various embodiments, a passive electronic component is provided. The passive electronic component includes for example a first electrically conductive layer on a substrate and a second electrically conductive layer on the first electrically conductive layer. A first trench is formed in the first and second electrically conductive layers. The first trench separates a first contact region from a second contact region. A dielectric is applied in a structured fashion on the second electrically conductive layer in the first contact region and at least partly on the substrate in the first trench such that said dielectric electrically insulates the first contact region from the second contact region. An electrically conductive electrode layer is applied in a structured fashion on the dielectric above the first contact region and on the second contact region. By way of example, the dielectric can be applied in a structured fashion on the second electrically conductive layer in the first contact region and at least partly in the first trench such that said dielectric encapsulates edges and/or side surfaces of the first and second electrically conductive layers in the first trench.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
FIG. 1 shows a first state of one embodiment of a passive electronic component during a production method for producing the passive electronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

A passive electronic component may include for example one, two or more capacitors and/or one, two or more electrical resistors. By way of example, the passive electronic component can be a combination of one, two or a plurality of capacitors with one, two or a plurality of electrical resistors. By way of example, one, two or more capacitors can be connected in series or in parallel with one, two or more electrical resistors.

An optoelectronic assembly may include for example a passive electronic component and one, two or more optoelectronic components. An optoelectronic component may include for example a component which absorbs electromagnetic radiation and/or a component which emits electromagnetic radiation. A component which absorbs electromagnetic radiation can be a solar cell, for example. In various embodiments, a component which emits electromagnetic radiation can be a semiconductor component which emits electromagnetic radiation and/or can be embodied as a diode which emits electromagnetic radiation, as an organic diode which emits electromagnetic radiation, as a transistor which emits electromagnetic radiation or as an organic transistor which emits electromagnetic radiation. The electromagnetic radiation can be for example light in the visible range, UV light and/or infrared light. In this connection, the component which emits electromagnetic radiation can be embodied for example as a light emitting diode (LED) as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

One embodiment of a method for producing a passive electronic component is explained with reference to FIGS. 1 to 6. In this case, FIGS. 1 to 6 illustrate embodiments of component parts of the passive electronic component in different states of the passive electronic component during the production method for producing the passive electronic component.

FIG. 1 shows one embodiment of a substrate 10 of the passive electronic component. The substrate 10 may include or be formed from, for example, glass, for example window glass, quartz, a semiconductor material and/or some other suitable material, for example boron silicate, aluminum silicate and/or a standard material from the display industry. Furthermore, the substrate 10 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The substrate 10 may include or be formed from a metal or a metal compound, for example copper, silver, gold, platinum or the like. The metal or a metal compound can also be embodied as a metal film or a metal-coated film. The substrate 10 may include one or more of the materials mentioned above.

The substrate 10 can be embodied as translucent or even transparent.

In various embodiments, the term "translucent" or "translucent layer" can be understood to mean that a layer is transmissive to electromagnetic radiation, for example to the radiation emitted by a component which emits electromagnetic radiation, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of radiation coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein electromagnetic radiation coupled into a structure (for example a layer) is also coupled out from the structure (for example layer) substantially without scattering or wavelength conversion. Thus, in various embodiments, "transparent" should be regarded as a special case of "translucent". For the case where, for example, a monochromatic or emission spectrum-limited optoelectronic component is intended to be provided, it may suffice for the optically translucent layer structure to be translucent at least in a partial range of the wavelength range of the desired monochromatic electromagnetic radiation or for the limited emission spectrum.

Figure 2:
FIG. 2 shows a second state of the passive electronic component during the production method for producing the passive electronic component.

FIG. 2 shows the substrate 10 in accordance with FIG. 1 and one embodiment of a first electrically conductive layer 12 formed on the substrate 10. By way of example, a barrier layer, which is not shown in FIG. 2 and is explained below with reference to FIG. 17, can be formed between the substrate 10 and the first electrically conductive layer 12.

The first electrically conductive layer 12 can be formed from a first electrically conductive material, such as, for example, from a metal or a transparent conductive oxide (TCO) or a layer stack including a plurality of layers of the same metal or different metals and/or the same TCO or different TCOs. Transparent conductive oxides can be for example transparent conductive substances, for example metal oxides, such as, for example, zinc oxide, tin oxide, cadmium oxide, titanium oxide, indium oxide, or indium tin oxide (ITO), for example ZnO, IN/ZnO, SnZnO or AlZnO. Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides can also belong to the group of TCOs and can be used in various embodiments. Furthermore, the TCOs do not necessarily correspond to a stoichiometric composition and can furthermore be p-doped or n-doped. In various embodiments, the first electrically conductive layer 12 may include a metal; for example Ag, Pt, Au, Mg, Al, Ba, In, Ag, Au, Mg, Ca, Sm or Li, and compounds, combinations or alloys of these materials. In various embodiments, the first electrically conductive can be formed by a layer stack of a combination of a layer of a metal on a layer of a TCO, or vice versa. One example is a silver layer applied on an indium tin oxide layer (ITO) (Ag on ITO) or ITO-Ag-ITO multilayers. The first electrically conductive material of the first electrically conductive layer 12 can be chosen for example such that it can withstand an etching process (explained below) for removing a second electrically conductive material (explained below).

In various embodiments, the first electrically conductive layer 12 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires. Furthermore, the first electrically conductive layer may include electrically conductive polymers or transition metal oxides or transparent electrically conductive oxides.

In various embodiments, the first electrically conductive layer 12 and/or the substrate 10 can be formed as translucent or transparent. In the case where the first electrically conductive layer includes or is formed from a metal, the first electrically conductive layer 12 can have for example a layer thickness of less than or equal to approximately 25 nm, for example a layer thickness of less than or equal to approximately 20 nm, for example a layer thickness of less than or equal to approximately 18 nm. Furthermore, the electrically conductive layer 12 can have for example a layer thickness of greater than or equal to approximately 10 nm, for example a layer thickness of greater than or equal to approximately 15 nm. In various embodiments, the first electrically conductive layer 12 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrically conductive layer 12 includes or is formed from a transparent conductive oxide (TCO), the first electrically conductive layer 12 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrically conductive layer 12 are formed from, for example, a network composed of metallic nanowires, for example composed of Ag, which can be combined with conductive polymers, a network composed of carbon nanotubes which can be combined with conductive polymers, or from graphene layers and composites, the first electrically conductive layer 12 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrically conductive layer 12 can be designed for forming anodes, that is to say hole-injecting electrodes, or cathodes, that is to say electron-injecting electrodes. The first electrically conductive layer 12 can be applied to the substrate 10 for example by sputtering, for example DC sputtering, physical vapor deposition (PVD) or the like. The first electrically conductive layer 12 can be applied to the substrate 10 for example in a planar fashion, that is to say without structure.

Figure 3:
FIG. 3 shows a third state of the passive electronic component during the production method for producing the passive electronic component.

FIG. 3 shows the substrate 10, the first electrically conductive layer 12 and one embodiment of a second electrically conductive layer 14, which is formed on the first electrically conductive layer 12. The second electrically conductive layer 14 may include for example chromium, aluminum, molybdenum, copper or silver. By way of example, the second electrically conductive layer 14 may include partial layers which include alternately different metals. By way of example, the second electrically conductive layer 12 can be formed from a stack Cr—Al—Cr, Mo—Al—Mo, Cr—Cu—Cr. By way of example, the second electrically conductive layer 14 can have a layer thickness of for example between 600 and 900 nm, for example between 700 and 800 nm. The partial layers can have, if appropriate, thicknesses of for example between 50 and 500 nm, for example between 100 and 400 nm. The second electrically conductive layer 14 can be applied to the first electrically conductive layer 12 for example by sputtering, for example DC sputtering, physical vapor deposition (PVD) or the like. The second electrically conductive layer 14 can be applied to the first electrically conductive layer 12 for example in a planar fashion, that is to say without structure.

Figure 4:
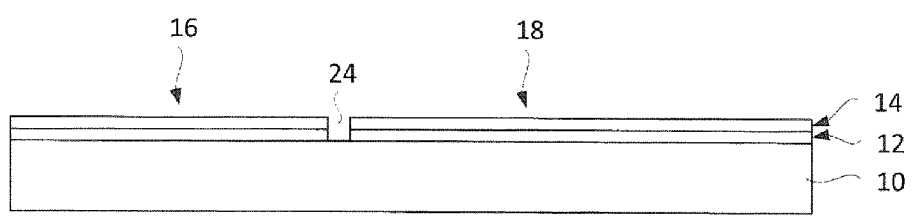
FIG. 4 shows a fourth state of the passive electronic component during the production method for producing the passive electronic component.

FIG. 4 shows the substrate 10 and the first and second electrically conductive layers 12, 14, wherein one embodiment of a first trench 24 is formed in the two electrically conductive layers 12, 14. The first trench can be formed by laser ablation, for example. The material of the substrate 10 is exposed in the first trench 24. In other words, a depth of the first trench corresponds to a common thickness of the two electrically conductive layers 12, 14. By way of example, a laser operated continuously or in a pulsed fashion, for example a femto-, nano- or pico-laser, can be used for the laser ablation. The laser can emit for example electromagnetic radiation in the IR range or in the UV range, for example at 200 to 300 nm, and/or with a power of 0.5 W to 1 W.

The first trench 24 separates a first contact region 16 from a second contact region 18. The first trench 24 can be part of a trench structure, which partly or completely delimit for example the first and/or second contact region 16, 18 in the planes of the two electrically conductive layers 12, 14. The first contact region 16 can serve for example for making electrical contact with the passive electronic component.

Figure 5:
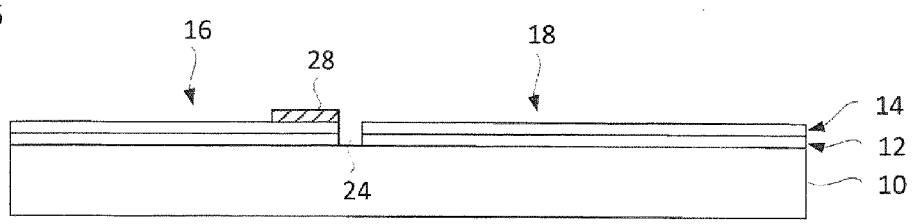
FIG. 5 shows a fifth state of the passive electronic component during the production method for producing the passive electronic component.

FIG. 5 shows the substrate 10 and the first and second electrically conductive layers 12, 14, wherein one embodiment of a dielectric 28 is applied in a structured fashion to the second electrically conductive layer 14 in a manner adjoining the trench 24. The dielectric 28 can be an electrically insulating substance, for example, which can subsequently prevent a direct current flow between the first or second electrically conductive layer 12, 14 in the first contact region 16 and the first or second electrically conductive layer 12, 14 in the second contact region 18. The dielectric 28 may include or be formed from, for example, a covering or a coating agent, for example a polymer and/or a resist. The resist may include for example a coating substance that can be applied in liquid or in pulverulent form. The fact that the dielectric 28 is applied in a structure fashion means that the desired structure is already formed during the application of the dielectric. Consequently, the area to be coated is coated only in partial regions dependent on the desired structure. The dielectric 28 can be applied in a structured fashion for example by a printing method, such as, for example, by screen printing, inkjet printing or flexographic printing, or blade coating.

The dielectric 28 can be chosen for example such that it can be softened by a subsequent treatment and/or can be brought to a flowable state. In addition to the electrical insulation, the dielectric 28 can serve as an etch stop in an etching process (explained in greater detail below) for removing the second electrically conductive layer 14 from partial regions. The dielectric 28 can be for example acid soluble and not base soluble. By way of example, the dielectric 28 can be soluble in chloroform and/or an organochlorine compound or a benzine-like compound, for example in hexyne or heptane. As an alternative thereto, the dielectric 28 can be base soluble and not acid soluble.

Figure 6:
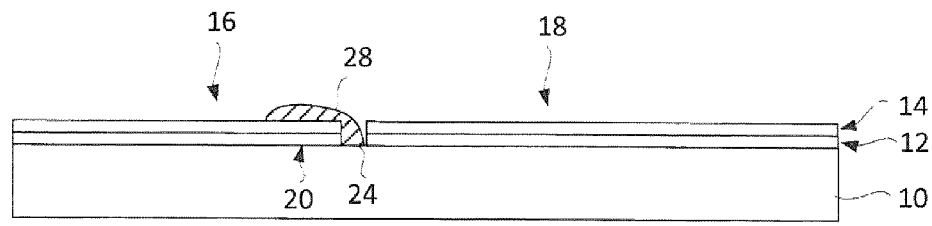
FIG. 6 shows a sixth state of the passive electronic component during the production method for producing the passive electronic component.

FIG. 6 shows the substrate 10 and the first and second electrically conductive layers 12, 14 with the dielectric 28, wherein the structure of the dielectric is rounded, such that the dielectric 28 covers and thus encapsulates the free side surfaces and/or edges of the first and second electrically conductive layers 12, 14. The structure of the dielectric can be rounded for example by the dielectric 28 being heated to such an extent until it is liquid or at least of low viscosity and flows over the exposed side surfaces and/or edges of the first and second electrically conductive layers 12, 14. The dielectric 28 can be heated for example by the entire arrangement including the dielectric 28 on the electrically conductive layers 12, 14 and the substrate 10 being heated, for example in a furnace, for example a reflow furnace.

Figure 7:
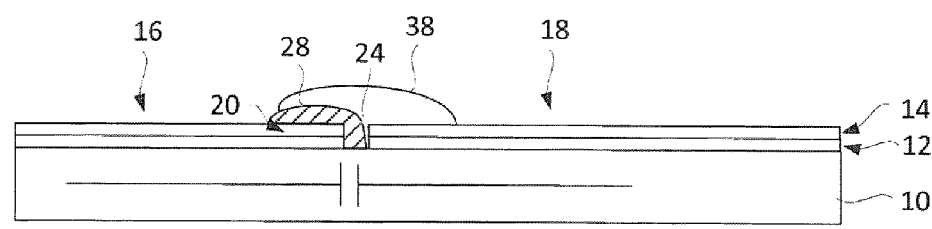
FIG. 7 shows one embodiment of the passive electronic component.

FIG. 7 shows the substrate 10 and the first and second electrically conductive layers 12, 14 with the dielectric 28, wherein an electrode layer 38 is applied in a structured fashion on the dielectric 28 and a part of the second contact region 18. The first contact region 16 between the substrate 10 and the electrode layer 38 serves as a first electrode, for example as an anode, of the passive electronic component. The electrode layer 38 on a side of the dielectric 28 facing away from the substrate 10 serves as a second electrode, for example as a cathode, of the passive electronic component. Electrical contact can be made with the passive electronic component via the first contact region 18, on the one hand, and electrical contact can be made with the passive electronic component via the second contact region 18, on the other hand. The passive electronic component can form a capacitor, for example.

In FIG. 7, the capacitor symbol on the substrate 10 symbolizes the function of the passive electronic component as a capacitor.

Figure 8:
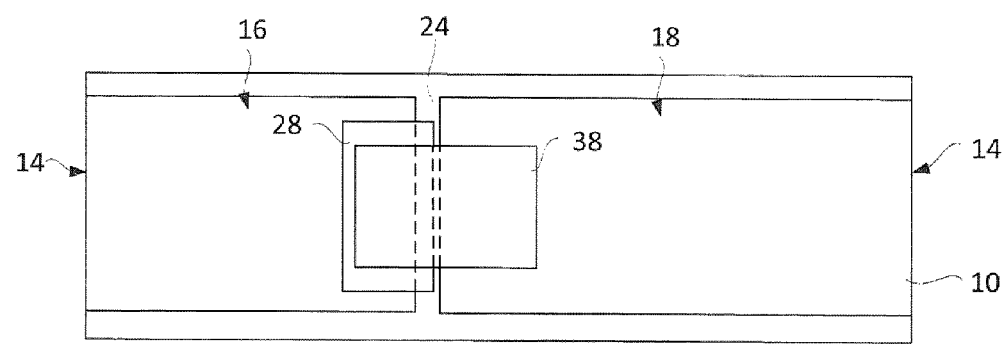
FIG. 8 shows a plan view of the passive electronic component in accordance with FIG. 7.

FIG. 8 shows a plan view of the passive electronic component in accordance with FIG. 7. FIG. 8 reveals that the first and second contact regions 16, 18, the dielectric 28 and/or the electrode layer 38 are/is embodied in a rectangular fashion, for example. As an alternative thereto, the first and second contact regions 16, 18 and/or the electrode layer 38 can be embodied in a square or circular fashion, for example. The trench structure (not illustrated in FIG. 8), which also includes the trench 24, can be embodied correspondingly.

Figure 9:
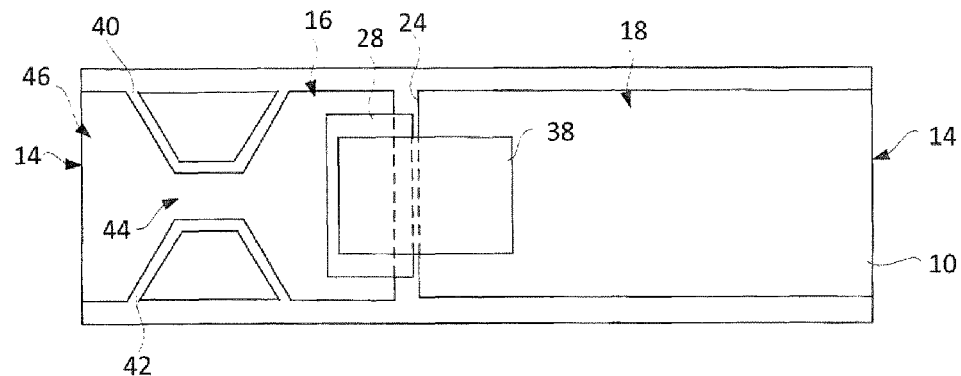
FIG. 9 shows a plan view of one embodiment of a passive electronic component.

FIG. 9 shows a plan view of one embodiment of a passive electronic component which includes for example the capacitor explained above. The passive electronic component includes for example a second trench 40 and a third trench 42, in which the substrate 10 is exposed. The second and third trenches 40, 42 can demarcate a resistance region 44, for example, which has a taper. The resistance region 44 can lead for example into the first contact region 16, on the one hand, and into a third contact region 46, on the other hand. The resistance region 44 forms an electrical resistor that is connected in series with the capacitor. The resistor is integrated into the layer structure of the passive electronic component and/or forms a part of the passive electronic component.

Figure 10:
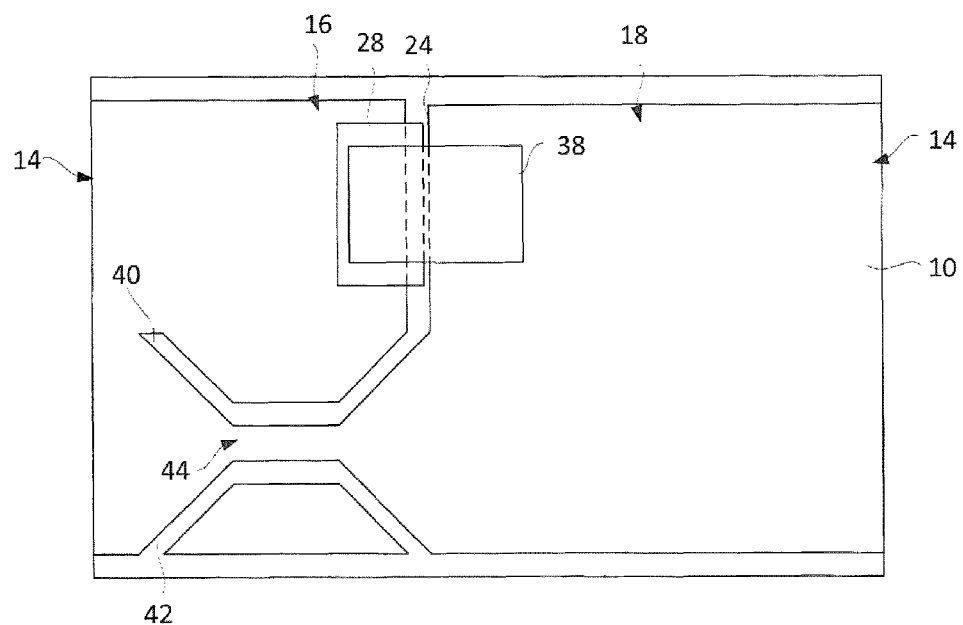
FIG. 10 shows a plan view of one embodiment of a passive electronic component.

FIG. 10 shows a plan view of one embodiment of a passive electronic component which includes for example the capacitor explained above. The passive electronic component includes for example the second trench 40 and the third trench 42, in which the substrate 10 is exposed. The second and third trenches 40, 42 can demarcate the resistance region 44, for example, which has the taper. The resistance region 44 can lead for example into the first contact region 16, on the one hand, and into the second contact region 18, on the other hand. The resistance region 44 forms an electrical resistor that is connected in parallel with the capacitor. The resistor is integrated into the layer structure of the passive electronic component and/or forms a part of the passive electronic component.

Figure 11:
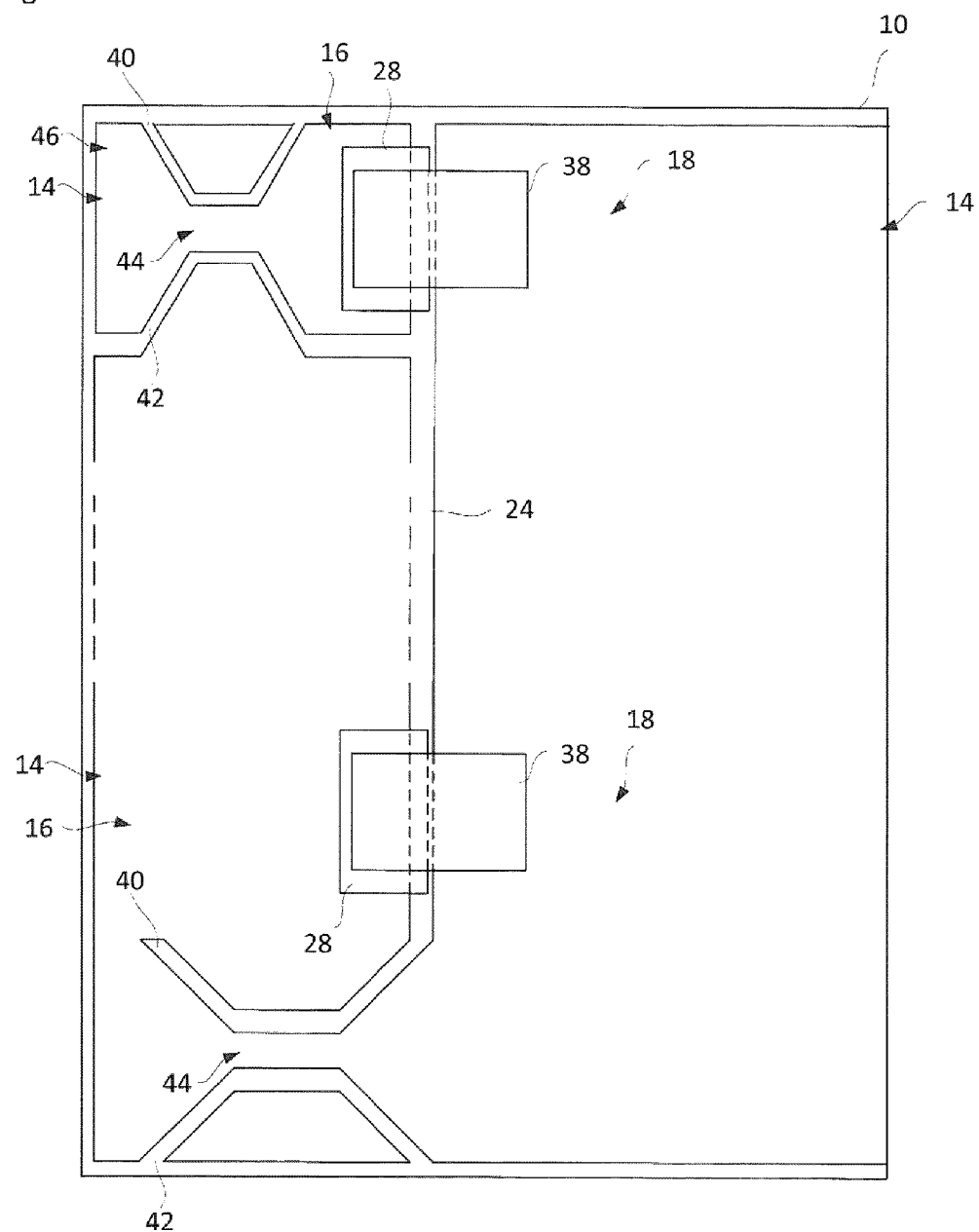
FIG. 11 shows a plan view of one embodiment of a passive electronic component.

FIG. 11 shows a plan view of an embodiment of a passive electronic component which includes for example two of the capacitors explained above and two of the resistors explained above. The passive electronic component includes for example two of the second trenches 40 and of the third trenches 42, in which the substrate 10 is exposed. The second and third trenches 40, 42 can demarcate in pairs one of the resistance regions 44, for example, which have the taper. One of the resistance regions 44 can lead for example into the first contact region 16, on the one hand, and into the third contact region 46, on the other hand, and can be connected in series with the corresponding capacitor. The other of the resistance regions 44 can lead for example into the first contact region 16, on the one hand, and into the second contact region 18, on the other hand, and can be connected in parallel with the corresponding resistance region 44. The pairs of capacitors and resistors are connected in parallel with one another. As an alternative thereto, pairs of capacitors and resistors can be connected in series one after another. Furthermore, further pairs or other combinations of resistors and capacitors can be arranged.

One embodiment of a method for producing an optoelectronic assembly is explained with reference to FIGS. 12 to 16. In this case, FIGS. 12 to 16 illustrate embodiments of component parts of the optoelectronic assembly in different states of the optoelectronic assembly during the production method for producing the optoelectronic assembly. The method steps can in principle be, for example, the same as in the method explained above. Therefore, exclusively the formation of the component parts of the optoelectronic assembly that are new in comparison with the method explained above is discussed hereinafter.

Figure 12:
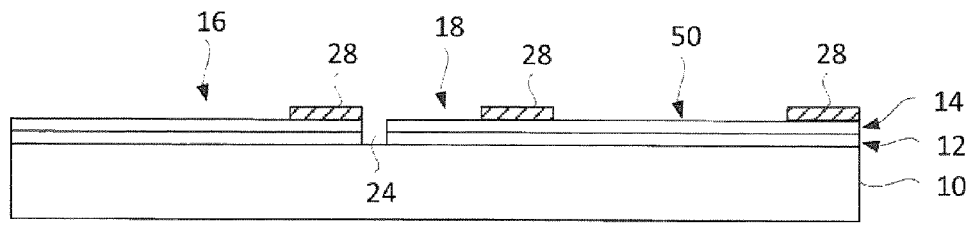
FIG. 12 shows a first state of one embodiment of an optoelectronic assembly during a production method for producing the optoelectronic assembly.

FIG. 12 shows the substrate 10 and the first and second electrically conductive layers 12, 14 with the dielectric 28, wherein the dielectric 28 is applied in a structured fashion to the second electrically conductive layer 14 such that said dielectric separates a component region 50 from the second contact region 28 and extends at least partly around the component region 50.

Figure 13:
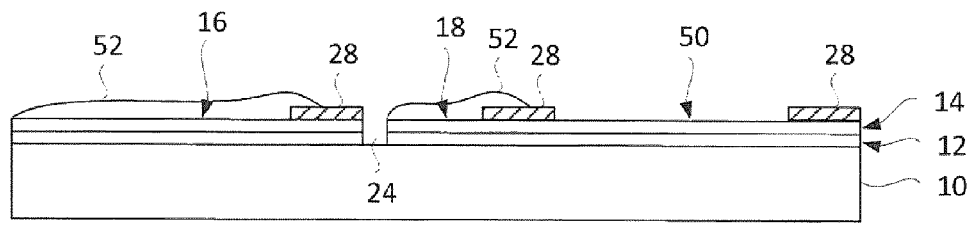
FIG. 13 shows a second state of the optoelectronic assembly in accordance with FIG. 12 during the production method for producing the optoelectronic assembly.

FIG. 13 shows the substrate 10 and the first and second electrically conductive layers 12, 14 with the dielectric 28, wherein one embodiment of a protective layer 52 is applied in a structured fashion to the first and second contact regions 16, 18. Adjoining the first and second contact regions 16, 18, the protective layer 52 partly overlaps the dielectric 28. The protective layer 52 serves as an etch stop for protecting the second electrically conductive layer in the contact regions 16, 18 during a subsequent etching process for removing the second electrically conductive layer 14 in the component region 50.

The fact that the protective layer 52 is applied in a structured fashion means that the desired structure is already formed during the process of applying the protective layer 52. The area to be coated is thus coated only in partial regions dependent on the desired structure. The protective layer 52 can be applied in a structured fashion for example by a printing method, such as, for example, by screen printing, inkjet printing or flexographic printing, or blade coating.

The material of the protective layer 52 can be, for example, base soluble and not acid soluble, for example if the dielectric 28 is acid soluble. By way of example, the material of the protective layer 52 can be soluble in sodium hydroxide, calcium hydroxide or tetramethylammonium hydroxide. As an alternative thereto, the material of the protective layer 52 can be acid soluble and/not base soluble, for example if the dielectric 28 is base soluble. The material of the protective layer 52 may include or be formed from a resist, for example.

Figure 14:
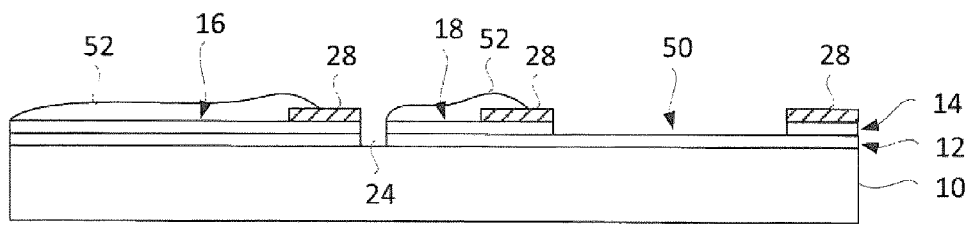
FIG. 14 shows a third state of the optoelectronic assembly in accordance with FIG. 13 during the production method for producing the optoelectronic assembly.

FIG. 14 shows the substrate 10 and the first and second electrically conductive layers 12, 14 with the dielectric 28 and the protective layer 52, wherein the second electrically conductive layer 14 is removed in the component region 50. The second electrically conductive layer 14 can be removed by an etching process, for example. By way of example, an etching bath, such as for example a 3% strength trichloroacetic acid in water, can be used for the etching of the second electrically conductive layer 14.

Figure 15:
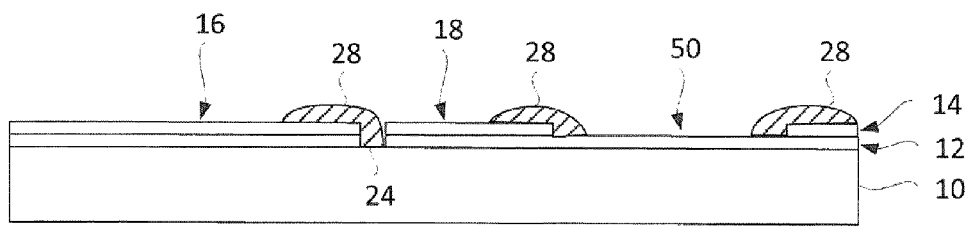
FIG. 15 shows a fourth state of the optoelectronic assembly in accordance with FIG. 14 during the production method for producing the optoelectronic assembly.

FIG. 15 shows the substrate 10 and the first and second electrically conductive layers 12, 14 with the dielectric 28, wherein the protective layer 52 is removed. The protective layer 52 can be removed by a suitable base and/or a basic solvent, for example. The contact regions 16, 18 are exposed by the removal of the protective layer 52.

Figure 16:
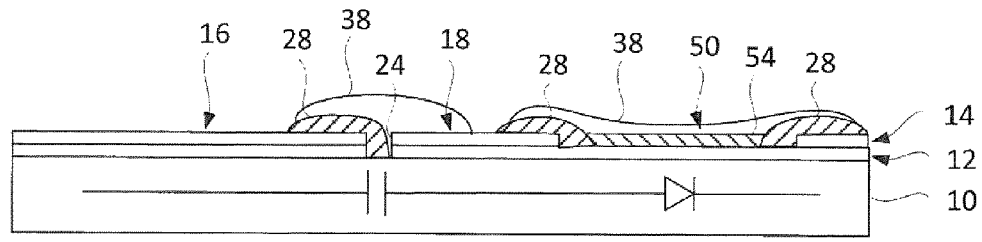
FIG. 16 shows a fifth state of the optoelectronic assembly in accordance with FIG. 15 during the production method for producing the optoelectronic assembly.

FIG. 16 shows the optoelectronic assembly including the substrate 10 and the first and second electrically conductive layers 12, 14 with the dielectric 28, wherein an organically functional layer 54 is formed in the component region 50. By way of example, a part of the electrode layer 38 can be applied in a structured fashion on the organically functional layer 54. The electrode layer 38 is applied in a structured fashion for example such that the organically functional layer is covered with a part of the electrode layer 38. The first electrically conductive layer 12 between the substrate 10 and the organically functional layer 54 can serve for example as a first electrode, for example as an anode, of the optoelectronic component. The electrode layer 38 on the organically functional layer can serve for example as a second electrode, for example as a cathode, of the optoelectronic component. The second electrode of the capacitor and the first electrode of the optoelectronic component can be directly physically contact-connected to one another, for example. By way of example, electrical contact can be made with the optoelectronic assembly via the second electrode of the optoelectronic component, on the one hand, and electrical contact can be made with the optoelectronic assembly via the first electrode of the capacitor, on the other hand, the capacitor and the optoelectronic component then being connected in series.

Figure 17:
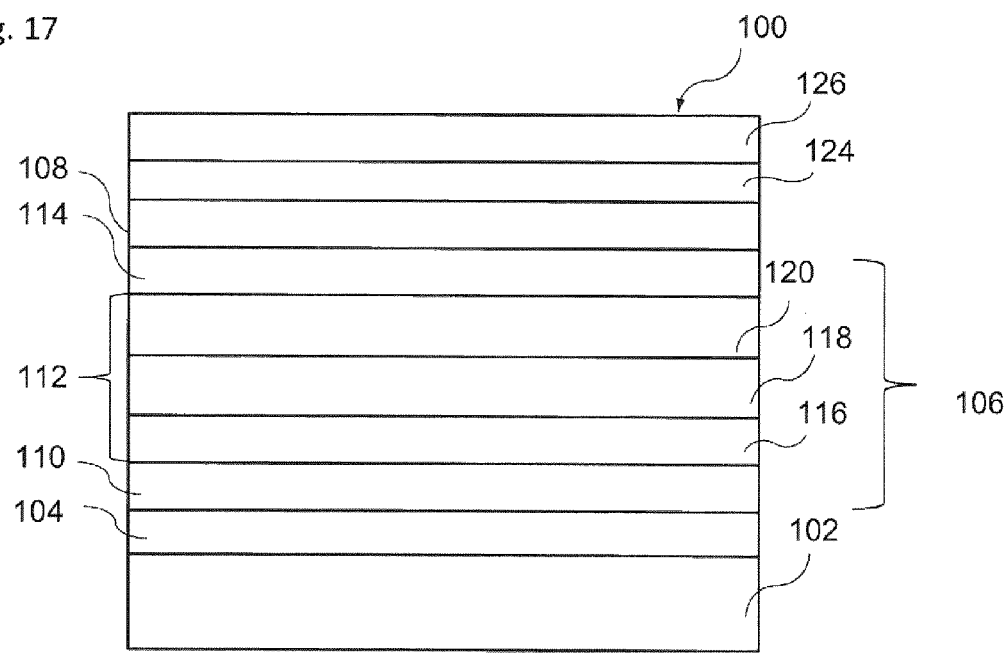
FIG. 17 shows one embodiment of a layer structure of an optoelectronic component.

In FIG. 17, the capacitor symbol and the diode symbol on the substrate 10 symbolize the series connection of the passive electronic component and the optoelectronic component.

The organically functional layer 54 can constitute for example the optically active region of the optoelectronic component, for example of an LED or OLED. The organically functional layer 54 can be formed for example in one, two or a plurality of process steps. By way of example, the organically functional layer 54 can be vapor deposited in vacuo. In the case of an OLED as optoelectronic component, the organically functional layer 54 may include for example one, two or a plurality of semiconducting, light emitting organic layers. One embodiment of an OLED and the detailed configuration of the layer structure of the OLED are explained more specifically below with reference to FIG. 17.

FIG. 17 shows a schematic cross-sectional view of a layer structure of one embodiment of an optoelectronic component, in accordance with various embodiments. The above-explained optoelectronic component of the optoelectronic assembly can be embodied for example in accordance with the layer structure explained below.

The optoelectronic component can be for example a component which emits electromagnetic radiation, for example a light emitting component 100, for example in the form of an organic light emitting diode. The optoelectronic component may include a carrier 102. The carrier 102 can represent a partial section of the substrate 10, for example, and can serve as a carrier element for electronic elements or layers, for example light emitting elements.

In various embodiments, the organic light emitting diode (or the component 100 which emits electromagnetic radiation in accordance with the embodiments described above or below) can be designed as a so-called top and bottom emitter. A top and/or bottom emitter can also be designated as an optically transparent component, for example a transparent organic light emitting diode.

In various embodiments, a barrier layer 104 can optionally be arranged on or above the carrier 102. The barrier layer 104 can for example also be regarded as a partial layer of the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light emitting component 100 can be arranged on or above the barrier layer 104. The electrically active region 106 can be understood as the region of the light emitting component 100 wherein an electric current flows for the operation of the light emitting component 100. In various embodiments, the electrically active region 106 may include a first electrode 110 of the optoelectronic component, a second electrode 114 of the optoelectronic component and an organic functional layer structure 112 of the optoelectronic component, as will be explained in even greater detail below.

In this regard, in various embodiments, the first electrode 110 of the optoelectronic component can be applied on or above the barrier layer 104 (or, if the barrier layer 104 is not present, on or above the carrier 102).

Furthermore, the electrically active region 106 of the light emitting component 100 can have an organic functional layer structure 112, which is applied or is formed on or above the first electrode 110 of the optoelectronic component. By way of example, the organic functional layer structure 112 of the optoelectronic component can represent the organically functional layer 54.

The organic functional layer structure 112 may include one or a plurality of emitter layers 118, for example including fluorescent and/or phosphorescent emitters, and one or a plurality of hole-conducting layers 116 (also designated as hole transport layer(s) 120). In various embodiments, one or a plurality of electron-conducting layers 116 (also designated as electron transport layer(s) 116) can alternatively or additionally be provided.

Examples of emitter materials which can be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, in particular, by a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 112 may generally include one or a plurality of electroluminescent layers. The one or the plurality of electroluminescent layers may include organic polymers, organic oligomers, organic monomers, organic small, non-polymeric molecules ("small molecules") or a combination of these substances. By way of example, the organic functional layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic functional layer structure 112 may include one or a plurality of functional layers embodied as an electron transport layer 116, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110 of the optoelectronic component, and the emitter layer 118 can be applied, for example deposited, on or above the hole transport layer 120. In various embodiments, the electron transport layer 116 can be applied, for example deposited, on or above the emitter layer 118.

In various embodiments, the organic functional layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

In various embodiments, the organic functional layer structure 112 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of two, three or four OLEDs arranged directly one above another, in which case for example organic functional layer structure 112 can have a layer thickness of a maximum of approximately 3 µm.

The light emitting component 100 may optionally generally include further organic functional layers, for example arranged on or above the one or the plurality of emitter layers 118 or on or above the electron transport layer(s) 116, which serve to further improve the functionality and thus the efficiency of the light emitting component 100.

The second electrode 114 of the optoelectronic component can be applied on or above the organic functional layer structure 112 or, if appropriate, on or above the one or the plurality of further organic functional layer structures. In various embodiments, the second electrode 114 of the optoelectronic component may include or be formed from the same substances as the first electrode 110, metals being particularly suitable in various embodiments. In various embodiments, the first electrode 110 of the optoelectronic component and/or the second electrode 114 of the optoelectronic component are formed as translucent or transparent. Consequently, the light emitting component 100 illustrated in FIG. 1 can be embodied as a top and/or bottom emitter (to put it another way, as a transparent light emitting component 100). The second electrode 114 of the optoelectronic component can be formed as an anode, that is to say as a hole-injecting electrode, or as a cathode, that is to say as an electron-injecting electrode.

An encapsulation 108, for example in the form of a barrier thin-film layer/thin-film encapsulation 108, can optionally also be formed on or above the second electrode 114 of the optoelectronic component and thus on or above the electrically active region 106. In the context of this application, a "barrier thin-film layer" 108 or an "insulator region thin film" 108 can be understood to mean, for example, a layer or a layer structure which is suitable for forming an insulator region against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by a suitable deposition method, e.g. by an atomic layer deposition (ALD) method in accordance with one configuration, e.g. a plasma enhanced atomic layer deposition (PEALD) method or a plasmaless atomic layer deposition (PLALD) method, or by a chemical vapor deposition (CVD) method in accordance with another configuration, e.g. a plasma enhanced chemical vapor deposition (PECVD) method or a plasmaless chemical vapor deposition (PLCVD) method, or alternatively by other suitable deposition methods.

By using an atomic layer deposition (ALD) method, it is possible for very thin layers to be deposited. In particular, layers having layer thicknesses in the atomic layer range can be deposited. In accordance with one configuration, in the case of a barrier thin-film layer 108 having a plurality of partial layers, all the partial layers can be formed by an atomic layer deposition method. A layer sequence including only ALD layers can also be designated as a "nanolaminate". In accordance with an alternative configuration, in the case of a barrier thin-film layer 108 including a plurality of partial layers, one or a plurality of partial layers of the barrier thin-film layer 108 can be deposited by a different deposition method than an atomic layer deposition method, for example by a vapor deposition method. In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers. In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent substance (or a substance mixture that is translucent or transparent).

In accordance with one configuration, the barrier thin-film layer 108 or (in the case of a layer stack having a plurality of partial layers) one or a plurality of the partial layers of the barrier thin-film layer 108 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index substances, to put it another way one or a plurality of substances having a high refractive index, for example having a refractive index of at least 2.

In one configuration, the cover 126, for example composed of glass, can be applied for example by frit bonding (glass frit bonding/glass soldering/seal glass bonding) by a conventional glass solder in the geometrical edge regions of the organic optoelectronic component 100 with the barrier thin-film layer 108. The cover 126 can extend for example over all optoelectronic components of the optoelectronic assembly.

In various embodiments, on or above the barrier thin-film layer 108, it is possible to provide an adhesive and/or a protective lacquer 124, by which, for example, a cover 126 (for example a glass cover 126) is fixed, for example adhesively bonded, on the barrier thin-film layer 108. In various embodiments, the optically translucent layer composed of adhesive and/or protective lacquer 124 can have a layer thickness of greater than 1 μm, for example a layer thickness of several μm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 of the optoelectronic component and the layer composed of adhesive and/or protective lacquer 124, an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, the adhesive can be designed in such a way that it itself has a refractive index which is less than the refractive index of the cover 126. Such an adhesive can be for example a low refractive index adhesive such as, for example, an acrylate which has a refractive index of approximately 1.3. Furthermore, a plurality of different adhesives forming an adhesive layer sequence can be provided.

Furthermore, it should be pointed out that, in various embodiments, an adhesive 124 can also be completely dispensed with, for example in embodiments in which the cover 126, for example composed of glass, are applied to the barrier thin-film layer 108 by plasma spraying, for example. In various embodiments, the cover 126 and/or the adhesive 124 can have a refractive index (for example at a wavelength of 633 nm) of 1.55.

Furthermore, in various embodiments, one or a plurality of antireflective layers (for example combined with the encapsulation 108, for example the barrier thin-film layer 108) can additionally be provided in the light emitting component 100.

The disclosure is not restricted to the embodiments indicated. By way of example, it is possible to produce more than one, for example two, three or more passive electronic components and/or optoelectronic components, for example connected in series or in parallel, in particular without carrying out a photolithographic process and/or with only one etching process. Furthermore, it is possible to combine one, two or more passive electronic components with the optoelectronic component or the optoelectronic components, for example electrically in series one after the other and/or in parallel with one another.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a passive electronic component, comprising:
    forming a first electrically conductive layer on a substrate,
    forming a second electrically conductive layer on the first electrically conductive layer,
    forming a first trench in the first and second electrically conductive layers such that the substrate is exposed in the first trench, wherein the first trench separates a first contact region from a second contact region,
    applying a dielectric in a structured fashion to the second electrically conductive layer in the first contact region and at least partly to the substrate in the first trench such that the dielectric electrically insulates the first contact region from the second contact region, and
    applying an electrically conductive electrode layer in a structured fashion to the dielectric above the first contact region and to the second contact region.

2. The method as claimed in claim 1, wherein a first electrode of a capacitor is formed by the first contact region between the dielectric and the substrate and a second electrode of a capacitor is formed by the electrode layer on a side of the dielectric facing away from the first contact region.

3. The method as claimed in claim 1, wherein, before the dielectric is applied, a second trench and at least one third trench are formed, which delimit a resistance region, which comprises a part of the first and second electrically conductive layers and which has a taper in a direction parallel to the electrically conductive layers and which leads into the first contact region on a first side of the taper.

4. The method as claimed in claim 3, wherein the resistance region is formed such that it leads into the second contact region on a second side of the taper and thus forms a resistor that is electrically connected in parallel with the capacitor.

5. The method as claimed in claim 3, wherein the resistance region is formed such that it forms a third contact region on a second side of the taper and thus forms a resistor that is electrically connected in series with the capacitor.

6. The method as claimed in claim 2, wherein a plurality of capacitors and/or resistors are formed electrically in parallel with one another and/or electrically in series one after another.

7. The method as claimed in claim 3, wherein at least one of the trenches is formed by laser ablation.

8. The method as claimed in claim 1, wherein the dielectric is applied by a printing method.

9. The method as claimed in claim 1, wherein the dielectric firstly is applied in a structured fashion to the second electrically conductive layer in such a way that it adjoins the first trench, and wherein then the dielectric is heated in such a way that it deforms and encapsulates edges and/or side surfaces of the first and second electrically conductive layers in the first trench.

10. A method for producing an optoelectronic assembly, comprising:
   forming a passive electronic component,
      the passive electronic component, comprising:
      a first electrically conductive layer on a substrate,
      a second electrically conductive layer on the first electrically conductive layer,
      a first trench formed in the first and second electrically conductive layers,
      wherein the first trench separates a first contact region from a second contact region,
      a dielectric, which is applied in a structured fashion to the second electrically conductive layer in the first contact region and at least partly on the substrate in the first trench such that the dielectric electrically insulates the first contact region from the second contact region, and an electrically conductive electrode layer, which is applied in a structured fashion to the dielectric above the first contact region and to the second contact region,
   applying the dielectric in a structured fashion to the second layer such that the dielectric demarcates a component region for forming an optoelectronic component relative to the second contact region,
   forming an optically functional layer in the component region, and
   applying the electrode layer in a structured fashion such that a part of the electrode layer covers the optically functional layer.

11. The method as claimed in claim 10, wherein before the optically functional layer is applied, the second electrically conductive layer is removed in the component region and the optically functional layer is applied to the first electrically conductive layer in the component region.

12. The method as claimed in claim 11, wherein
   after the structured application of the dielectric and before the removal of the second electrically conductive layer in the component region, a protective layer is applied in a structured fashion to the first contact region and the second contact region and/or to the resistance region such that the contact regions and/or the resistance region are covered with the material of the protective layer,
   the protective layer protects the contact regions and/or the resistance region during the removal of the second electrically conductive layer, such that the second electrically conductive layer is maintained in the contact regions and/or the resistance region, and
   the protective layer is removed after the removal of the second electrically conductive layer in the component region.

13. The method as claimed in claim 11, wherein a first electrode of an optoelectronic component is formed by the first electrically conductive layer between the optically functional layer and the substrate and a second electrode of the optoelectronic component is formed by the electrode layer on a side of the optically functional layer facing away from the first electrode, wherein the optoelectronic component comprises the organically functional layer between the first and second electrodes of the first optoelectronic component.

14. The method as claimed in claim 13, wherein the passive electronic component and the optoelectronic component are connected in series via the second contact region.

15. The method as claimed in claim 12, wherein the protective layer is applied by a printing method.

16. A passive electronic component, comprising:
   a first electrically conductive layer on a substrate,
   a second electrically conductive layer on the first electrically conductive layer,
   a first trench in the first and second electrically conductive layers, wherein the first trench separates a first contact region from a second contact region,
   a dielectric, which is applied in a structured fashion on the second electrically conductive layer in the first contact region and at least partly on the substrate in the first trench such that said dielectric electrically insulates the first contact region from the second contact region, and
   an electrically conductive electrode layer, which is applied in a structured fashion on the dielectric above the first contact region and at least partly on the second contact region.

17. The method as claimed in claim 4, wherein two, three or more resistors are formed electrically in parallel with one another and/or electrically in series one after another.

18. The method as claimed in claim 5, wherein two, three or more resistors are formed electrically in parallel with one another and/or electrically in series one after another.

* * * * *